United States Patent
Yang et al.

(10) Patent No.: US 7,797,656 B2
(45) Date of Patent: Sep. 14, 2010

(54) METHOD OF CHECKING AND CORRECTING MASK PATTERN

(75) Inventors: Yu-Shiang Yang, Tainan County (TW); Hui-Fang Kuo, Kaohsiung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 317 days.

(21) Appl. No.: 12/019,640

(22) Filed: Jan. 25, 2008

(65) Prior Publication Data

US 2009/0193385 A1    Jul. 30, 2009

(51) Int. Cl.
G06F 9/45 (2006.01)
G06F 17/50 (2006.01)

(52) U.S. Cl. ............... 716/5; 716/4; 716/19; 716/20; 716/21; 430/5; 430/30

(58) Field of Classification Search .............. 716/4–5, 716/19–21; 430/5, 30
See application file for complete search history.

(56) References Cited

U.S. PATENT DOCUMENTS

2003/0118917 A1* 6/2003 Zhang et al. ............... 430/5
2007/0136713 A1* 6/2007 Hetzel et al. ............... 716/12

* cited by examiner

*Primary Examiner*—Paul Dinh
*Assistant Examiner*—Nha T Nguyen
(74) *Attorney, Agent, or Firm*—Winston Hsu

(57) ABSTRACT

The present invention provides a method of checking and correcting a mask pattern. The method includes inputting a mask pattern, wherein the mask pattern includes at least a segment; inputting a process rule; selecting an edge, which fits in with an orientation model, as a target edge, wherein two ends of the target edge are an ahead direction and a behind direction, and the ahead direction and the behind direction each further comprise at least a checking point; identifying an interacting edge from the mask pattern along the checking directions; performing a process rule check to provide a correcting value; performing a first correction to provide a first bias to the target edge; and performing a second correction to provide a second bias to the interacting edge, wherein a sum of the first bias and the second bias equals the correcting value.

14 Claims, 10 Drawing Sheets

METHOD OF CHECKING AND CORRECTING MASK PATTERN

BACKGROUND OF THE INVENTION

1. Field of the Invention

The present invention provides a method of checking and correcting a mask pattern, and more particularly, to a method of using an orientation model to sort all edges of a mask pattern into different situations, and then performing the checking and correcting to all situations one by one.

2. Description of the Prior Art

In semiconductor fabrication, lithography process is an important step to transfer an integrated circuit layout to semiconductor wafers. Generally, a wafer manufacture company designs a mask layout according to an integrated circuit layout; and then fabricates a mask having the designed mask layout. Afterwards, by virtue of lithography processes, the pattern on the mask (i.e. the mask pattern) is transferred to a photoresist layer on the surface of a semiconductor wafer in a specific scale.

As the complexity and integration of integrated circuit continue to progress, the size of every segment of a mask pattern is designed smaller. However, the critical dimension (CD) of every segment fabricated by exposures is limited to the resolution limit of the optical exposure tool while transferring the mask pattern. One problem that easily arises during the exposures of a mask pattern with high-density arranged segments to form a pattern on a photoresist is optical proximity effect. Therefore, the resolution loss occurs because of overexposure or underexposure, so as to bring a deviation of the pattern on the photoresist from the original mask pattern. Many saving methods have been used for improving the deviation caused from the optical proximity effect in order to improve the quality of the transferred pattern. The most popular method is optical proximity correction (OPC). And there have been a variety of commercial optical proximity correction software, which can correct the mask pattern theoretically to acquire more correct pattern on a wafer.

A mask pattern corrected by the optical proximity correction must be inspected by a process rule check (PRC) to confirm the correctness of the mask pattern. If the corrected mask pattern completely obeys the rules of the process rule check, the mask pattern is then outputted and provided for lithography process. Inversely, if a portion or all portions of the mask pattern violates the rules of process rule check, the mask pattern needs to be re-modified. The process rule check (PRC) inspects line ends and corners of each segment of a mask pattern to verify that if those geometrical patterns obey the limitation of the critical width and the critical space of the designed integrated circuit layout.

However, the modifying methods of typical optical proximity correction software do not completely take into account the rules of critical width and critical space, resulting in repeated steps of optical proximity correction and process rule check. Therefore, the output of a mask pattern is delayed; and the loading of computer resources is also increased. Sometimes, judgments from those of professional skill in the art are needed to overcome the problems described above, so as to waste the human resources.

During the repeated steps of optical proximity correction and process rule check, each optical proximity correction would modify the mask pattern base on the previous result of process rule check. However, currently process rule checks, which only inspect the geometrical pattern of line ends and corners of the mask pattern, can no longer keep up with the progressing of the complexity and integration of the integrated circuit. Therefore, the deviation from original designed layout can be found only after outputting the mask pattern and after the exposure of lithography processes to form the pattern on the wafers, so as to fabricate the mask over again. And the fabrication cost is greatly increased. Accordingly, a method of checking and correcting mask pattern is provided to improve upon the deficiencies from the prior art.

SUMMARY OF THE INVENTION

The present invention provides a method of checking and correcting a mask pattern, and more particularly, to a method of using an orientation model to sort all edges of a mask pattern into different situations, and then performing the checking and correcting to all situations one by one.

According to the preferred embodiment of the present invention, the present invention provides a method of checking and correcting a mask platter. The method comprises inputting a mask pattern, wherein the mask pattern comprises at least a segment; inputting a process rule; selecting an edge, which fits in with an orientation model, as a target edge, wherein two ends of the target edge are an ahead direction and a behind direction, and the ahead direction and the behind direction each further comprise at least a checking point; identifying an interacting edge from the mask pattern along the checking directions; performing a process rule check to provide a correcting value; performing a first correction to provide a first bias to the target edge; and performing a second correction to provide a second bias to the interacting edge, wherein a sum of the first bias and the second bias equals the correcting value.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
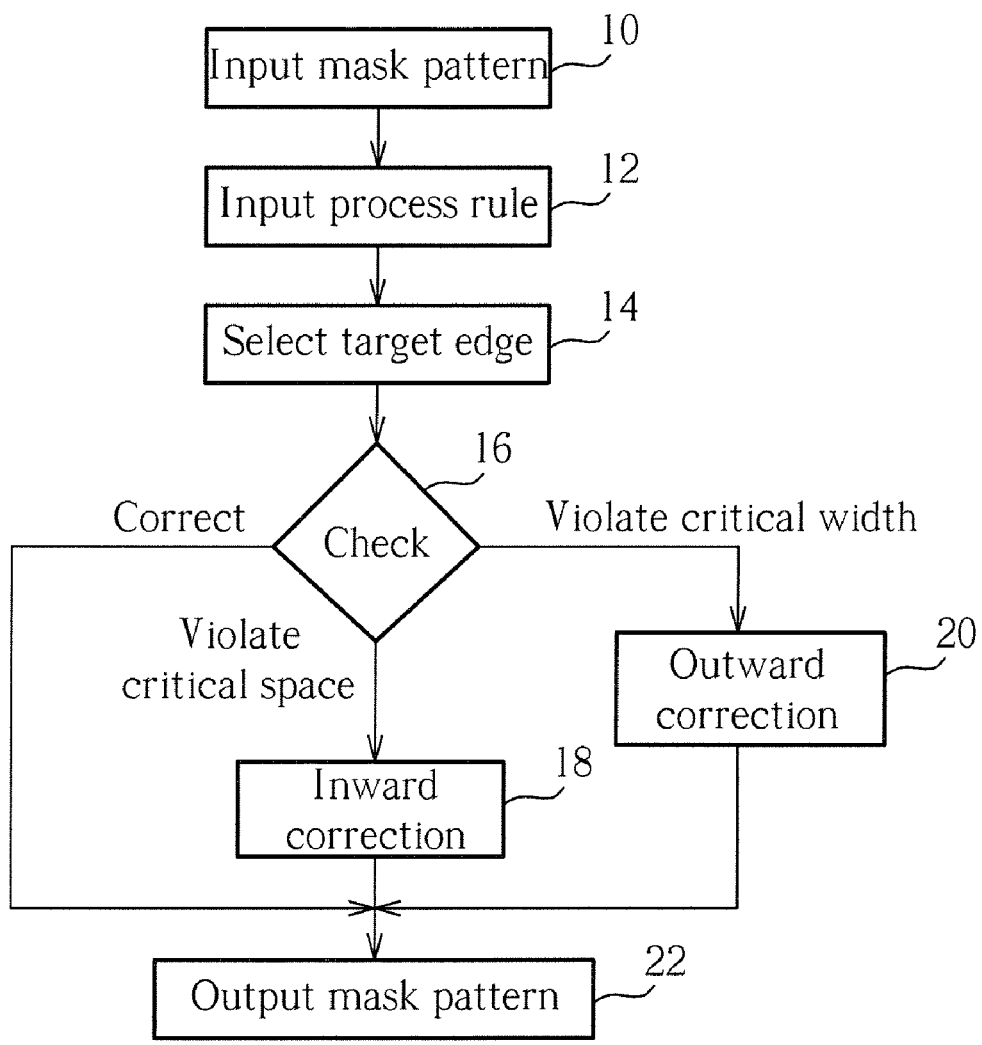
FIG. 1 is a flow chart, illustrating a method of checking and correcting a mask pattern of the present invention.

Please refer to FIG. 1, which is a flow chart illustrating a method of checking and correcting a mask pattern of the present invention. The method of verifying a mask pattern includes following steps. First, step 10 is carried out to input a mask pattern, which includes at least a segment. The mask pattern has been corrected by optical proximity corrections. The optical proximity corrections are prevalent correction methods used to modify widths, line ends and corners of each segment of a mask pattern in semiconductor industry. Then, step 12 is carried out to input a process rule. The process rule includes the critical width and the critical space or other design rules, which may derivate from the integrated circuits of the line width of 65 nm, 45 nm or below. Afterwards, step 14 is carried out to select a target edge to be inspected. If the target edge is correct, i.e. the target edge completely fits in with the process rule, step 22 is directly carried out to output the mask pattern for the lithography processes. However, if the target edge is incorrect, i.e. the target edge violates the process rule, a correcting value is provided to perform an inward correction or an outward correction to the target edge. If the target edge violates the critical space, step 18 is carried out to perform an inward correction. If the target edge violates the critical width, step 20 is carried out to perform an outward correction. Finally, step 22 is carried out to output the corrected mask pattern for fabricating the demanded mask.

Figure 2:
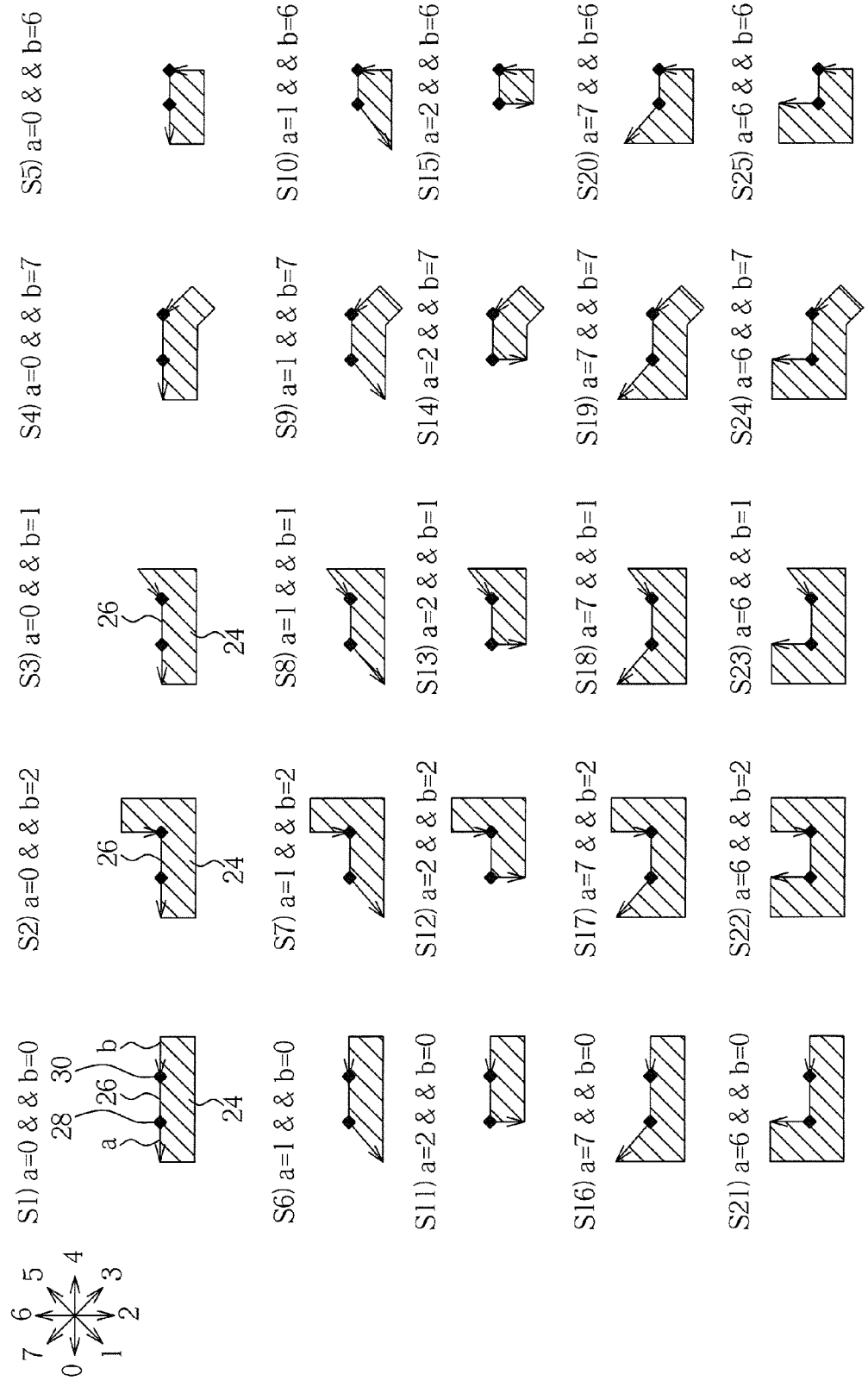
FIG. 2 is a schematic diagram, illustrating 25 situations of an orientation model according to a preferred embodiment of the present invention.

In step 14, the method of selecting the target edge is basis on an orientation model, which sorts the segment edges of the mask pattern into different situations. Each kind of situation is then checked or corrected one by one. According to a preferred embodiment of the present invention, the orientation model sorts all segment edges of the mask pattern into twenty-five situations, as shown in FIG. 2. Please refer to FIG. 2. FIG. 2 is a schematic diagram, illustrating the twenty-five situations of the orientation model according to a preferred embodiment of the present invention. The orientation model is based on a coordinate axis, which comprises eight directions obtained by equally dividing a plane by an angle of 45°. The eight directions are direction 0, direction 1, direction 2, direction 3, direction 4, direction 5, direction 6, and direction 7. The twenty-five situations of the orientation model will be described in detail below.

Each of the devices shown in FIG. 2 is explained first. Every situation illustrates with a segment 24, a target edge 26, an ahead checking point 28, a behind checking point 30, an ahead direction a, and a behind direction b. The segment 24 is a portion of an inputted mask pattern, which is corrected by at least an optical proximity correction. The target edge 26 is an edge selected from the segment 24 to be checked. The ahead checking point 28 and the behind checking point 30 are two ends of the target edge 26, respectively. The ahead direction a is the first direction extending from the ahead checking point 28 along the periphery of the segment 24; and the behind direction b is the last direction linking to the behind checking point 30 along the periphery of the segment 24. Each of the ahead direction a and the behind direction b is parallel to one of the directions of the coordinate axis, respectively.

In situation 1, the ahead direction a, which extends from the ahead checking point 28 of the target edge 26 along the periphery of the segment 24, is parallel to the direction 0 of the coordinate axis (i.e. a=0); and the behind direction b, which links to the behind checking point 30, is parallel to the direction 0 of the coordinate axis (i.e. b=0). Therefore, the situation 1 is defined as the target edge 26 of a=0 and b=0. In situation 2, the ahead direction a, which extends from the ahead checking point 28 of the target edge 26 along the periphery of the segment 24, is parallel to the direction 0 of the coordinate axis (i.e. a=0); and the behind direction b, which links to the behind checking point 30, is parallel to the direction 2 of the coordinate axis (i.e. b=2). Therefore, the situation 2 is defined as the target edge 26 of a=0 and b=2. In situation 3, the ahead direction a, which extends from the ahead checking point 28 of the target edge 26 along the periphery of the segment 24, is parallel to the direction 0 of the coordinate axis (i.e. a=0); and the behind direction b, links to the behind checking point 30, is parallel to the direction 1 (i.e. b=1). Therefore, the situation 3 is defined as the target edge 26 of a=0 and b=1. The definitions of situation 4 to situation 25 are defined by the same method described above according to the directions of the ahead direction a and the behind direction b, and the details of which are not further explained herein for the sake of brevity.

Accordingly, the method of the present invention sorts all edges of the segments of the mask pattern into twenty-five situations, which includes situation 1 (a=0; b=0), situation 2 (a=0; b=b), situation 3 (a=0; b=1), situation 4 (a=0; b=7), situation 5 (a=0; b=6), situation 6 (a=1; b=0), situation 7 (a=1; b=2), situation 8 (a=1; b=2), situation 9 (a=1; b=2), situation 10 (a=1; b=6), situation 11 (a=2; b=0), situation 12 (a=2; b=2), situation 13 (a=2; b=1), situation 14 (a=2; b=7), situation 15 (a=2; b=6), situation 16 (a=7; b=0), situation 17 (a=7; b=2), situation 18 (a=7; b=1), situation 19 (a=7; b=7), situation 20 (a=7; b=6), situation 21 (a=6; b=0), situation 22 (a=6; b=2), situation 23 (a=6; b=1), situation 24 (a=6; b=7), and situation 25 (a=6; b=6) as shown in FIG. 2.

Figure 3:
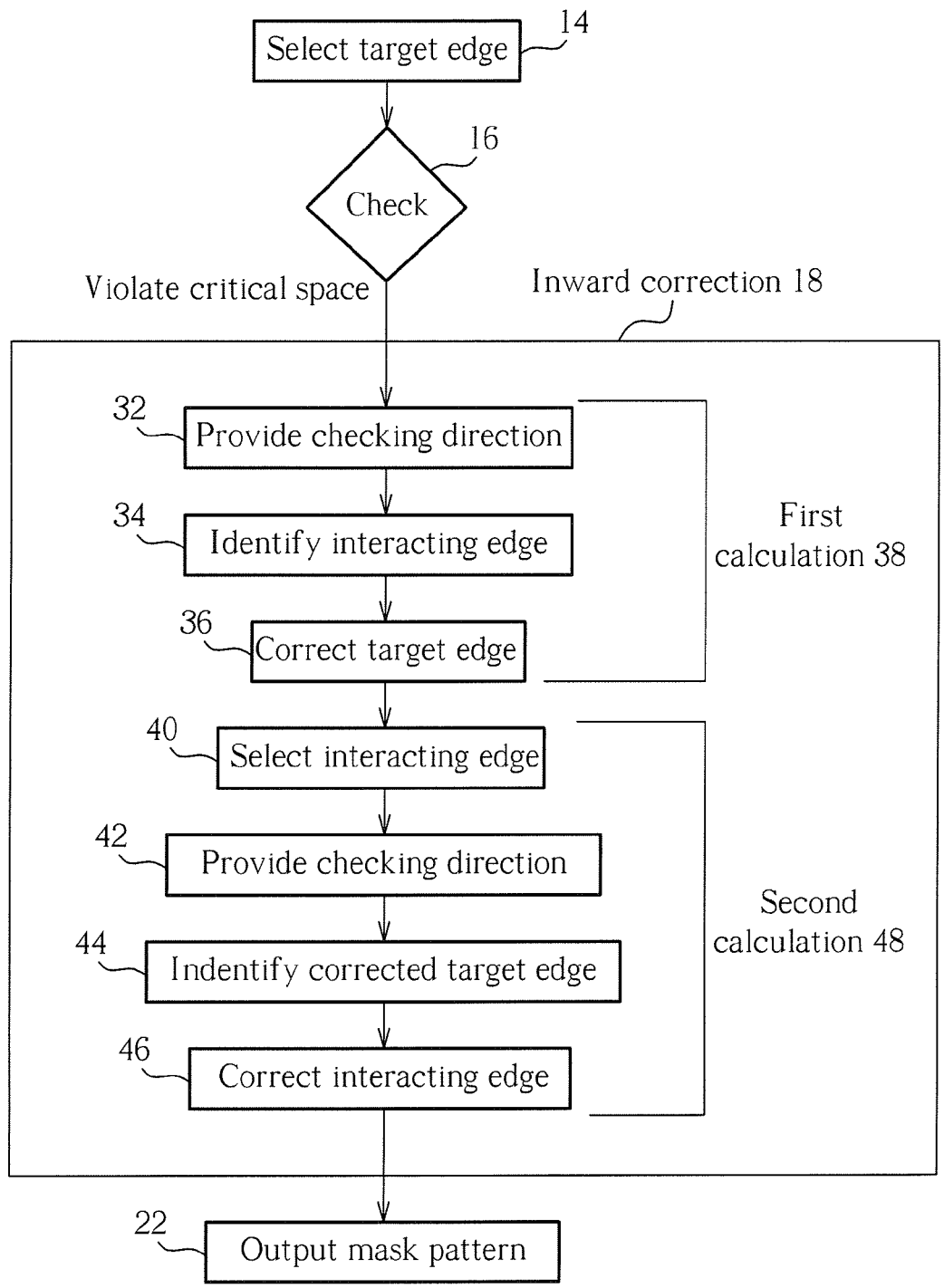
FIG. 3 is a flow chart, illustrating an inward correction of the present invention.

Please refer to FIG. 3, which is a flow chart illustrating an inward correction of the present invention. First, as the target edge has to be corrected inward (i.e. as the target edge violates the critical space), step 32 is carried out to provide checking directions. Then, step 34 is carried out to identify an interacting edge. Afterwards, step 36 is carried out to correct the target edge. Step 32, step 34, and step 36 constitute a first calculation 38 of the inward correction 38. In step 32, the checking directions extend from the ahead checking point or the behind checking point positioned on the two ends of the target edge. In which, the checking points are obtained by extending along the target edge toward the two-ends directions of the target edge respectively until the defining situation of the segment is changed (i.e. the boundary between the inside segment and the outside segment). In step 34, the interacting edge is identified from the ahead and the behind checking points along the checking directions, which are vertical to the target edge, and toward the outside segment until the defining situation of the segment is changed (i.e. the boundary between the inside segment and the outside segment). The edge, where the defining situation of the segment is changed, is the interacting edge. In step 36, the correction is to provide a first bias to correct the shape and the position of the target edge according to the parameters, such as the critical width, the distance between the target edge and the interacting edge, the proportion of the length of the target edge to the length of the interacting edge, and the relative position of the target edge to the interacting edge, etc.

After correcting the target edge, a second calculation 48, which is constituted of steps 40, 42, 44, 46, is carried out. First, step 40 is carried out to select the interacting edge identified in the first calculation 38 as the target edge for the second calculation 48. Then, step 42 is carried out to provide checking directions. The checking directions extend from the ahead checking point or the behind checking point positioned at the ends of the interacting edge, respectively. Afterward, step 44 is carried out to identify the corrected target edge, which is obtained by the first calculation 38. Finally, step 46 is carried out to correct the interacting edge. Among which, the correction is to provide a second bias to correct the shape and the position of the interacting edge according to the parameters, such as the critical width, the distance between the target edge and the interacting edge, the proportion of the length of the target edge to the length of the interacting edge, and the relative position of the target edge to the interacting edge, etc.

After performing the first calculation 38 and the second calculation 48, i.e. after performing the inward correction, the corrected mask pattern, which is corrected twice, is outputted.

Figure 4:
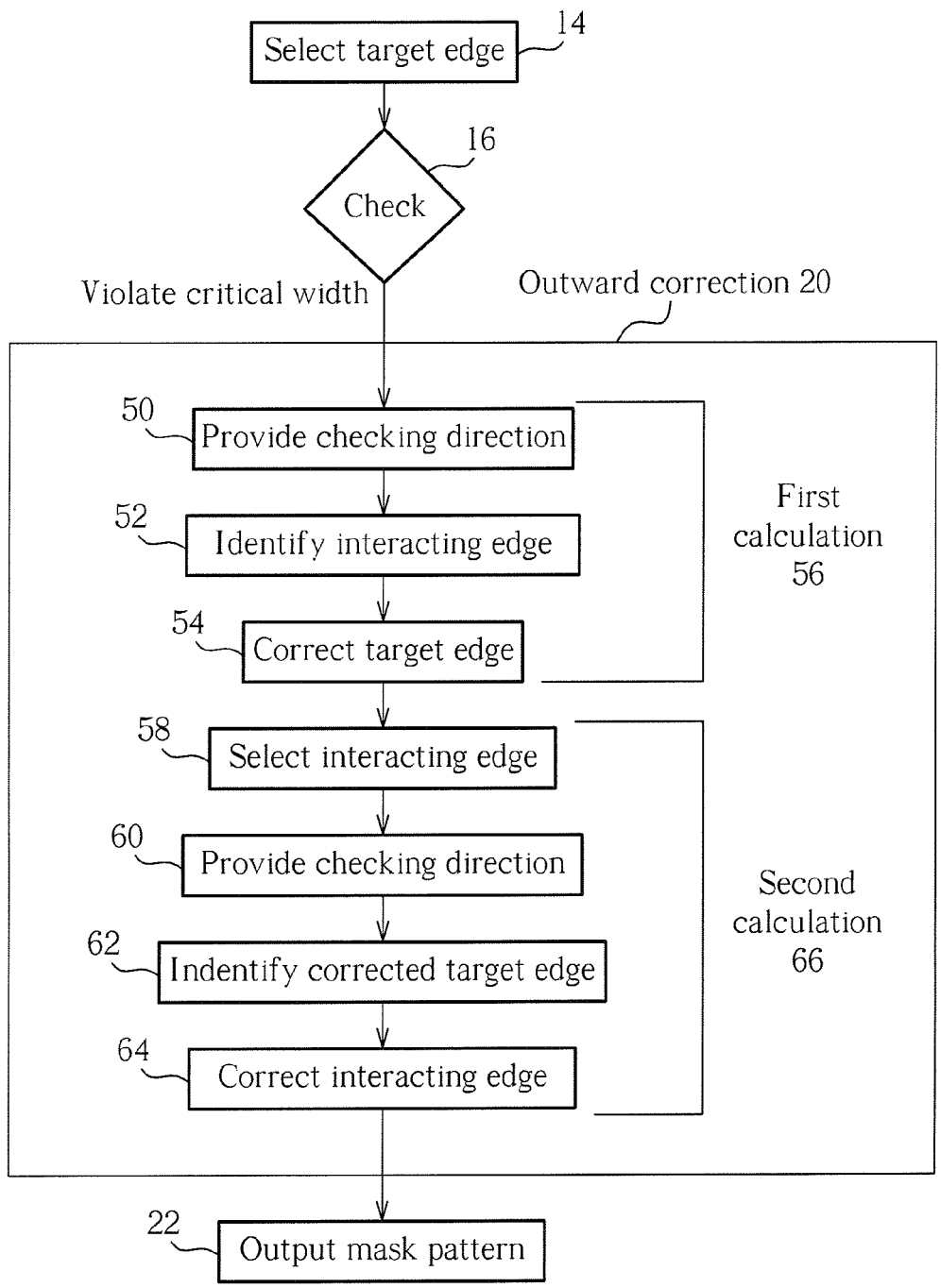
FIG. 4 is a flow chart, illustrating an outward correction of the present invention.

Please refer to FIG. 4, which is a flow chart illustrating an outward correction of the present invention. First, as the target edge needs to be corrected outward (i.e. the target edge violates the critical width), step 50 is carried out to provide checking directions. Then, step 52 is carried out to identify an interacting edge. Afterwards, step 54 is carried out to correct the target edge. Steps 50, 52, 54 constitute a first calculation 56 of the inward correction. In step 50, the checking directions extend from the ahead checking point or the behind checking point. In which, the checking points are obtained by extending along the target edge toward the two ends directions of the target edge respectively until the defining situation of the segment is changed (i.e. the boundary between the inside segment and the outside segment). In step 52, the interacting edge is identified from the ahead and the behind checking points along the checking directions, which are vertical to the target edge, and toward the inside segment until the defining situation of the segment is changed (i.e. the boundary between the inside segment and the outside segment). The edge, where the defining situation of the segment is changed, is the interacting edge. In step 54, the correction is to provide a first bias to correct the shape and the position of the target edge according to the parameters, such as the critical width, the distance between the target edge and the interacting edge, the proportion of the length of the target edge to the length of the interacting edge, and the relative position of the target edge to the interacting edge, etc.

After correcting the target edge, a second calculation 66, which is constituted of steps 58, 60, 62, 64, is carried out. First, step 58 is carried out to select the interacting edge identified in the first calculation 46 as the target edge for the second calculation 66. Then, step 60 is carried out to provide checking directions. The checking directions extend from the ahead checking point or the behind checking point positioned at the two ends of the interacting edge. Afterward, step 62 is carried out to identify the corrected target edge, which is corrected in the first calculation 46. Then, step 64 is carried out to correct the interacting edge. Among which, the correction is to provide a second bias to the interacting edge to correct the shape and the position of the target edge according to the parameters, such as the critical width, the distance between the target edge and the interacting edge, the proportion of the length of the target edge to the length of the interacting edge, and the relative position of the target edge to the interacting edge, etc.

After performing the first calculation 56 and the second calculation 66, i.e. after performing the outward correction, the corrected mask pattern, which is corrected twice, is outputted.

Figure 5:
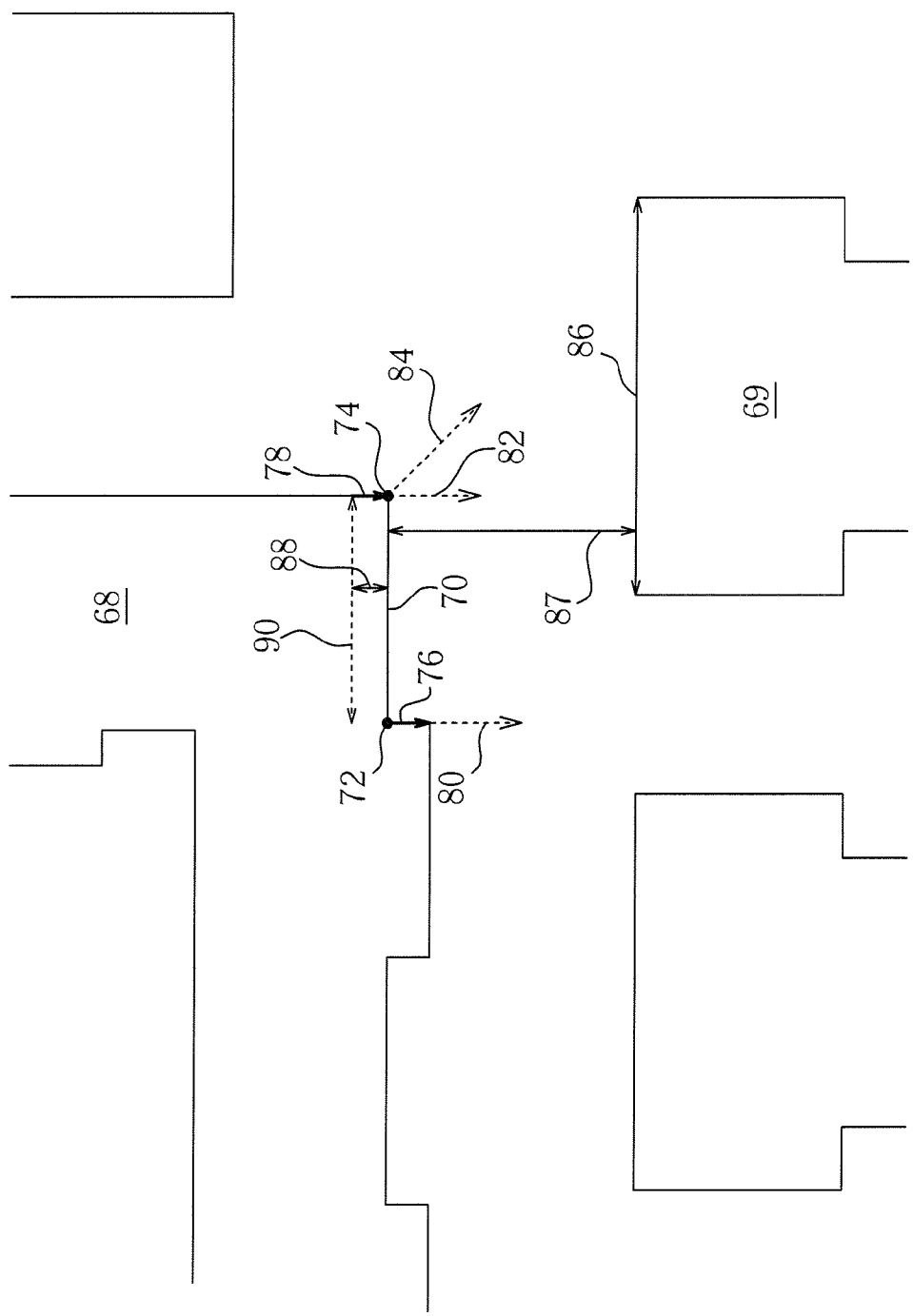
FIG. 5 to FIG. 7 are schematic diagrams, illustrating an inward correction according to a preferred embodiment of the present invention.
Figure 6:
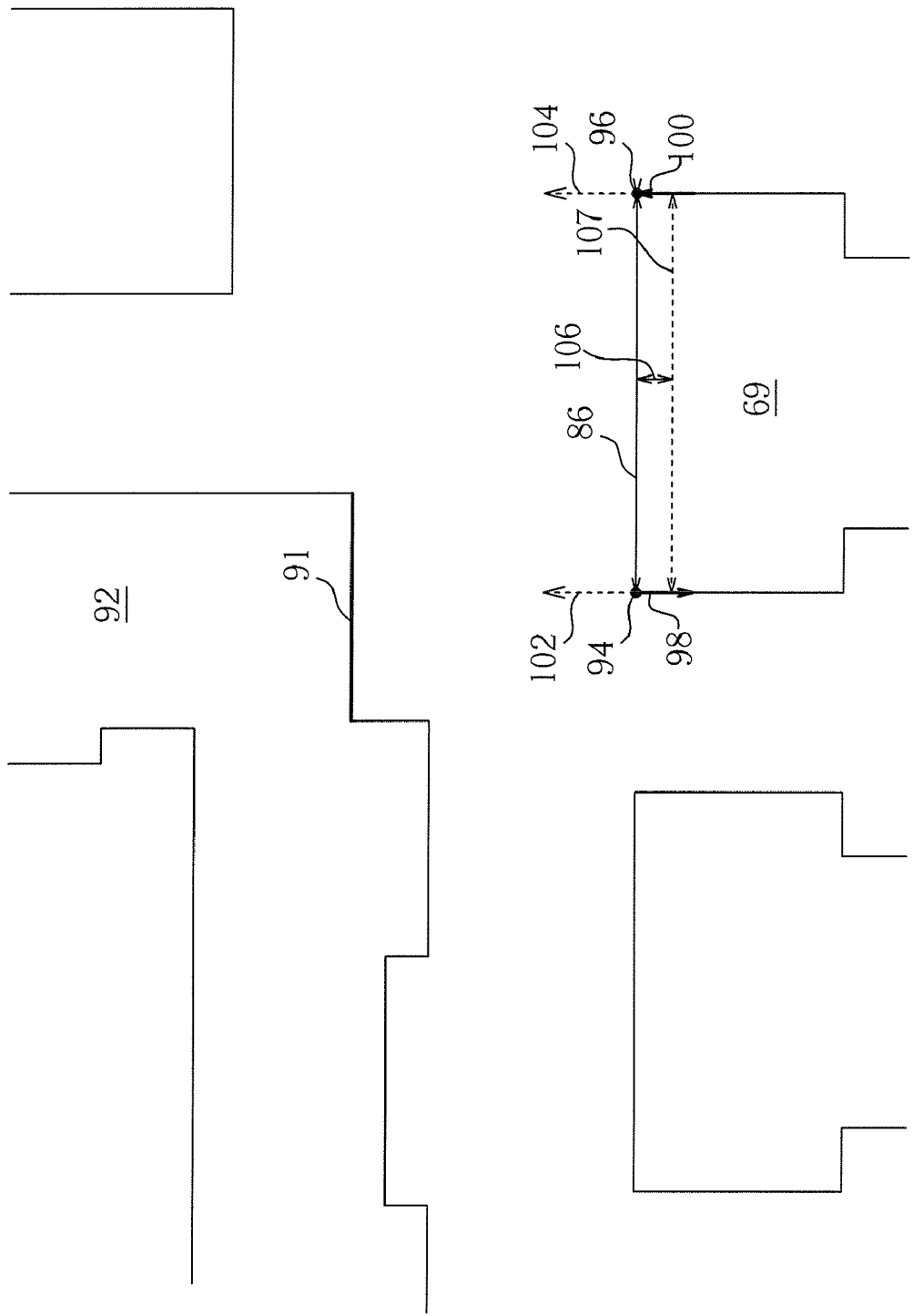
Figure 7:
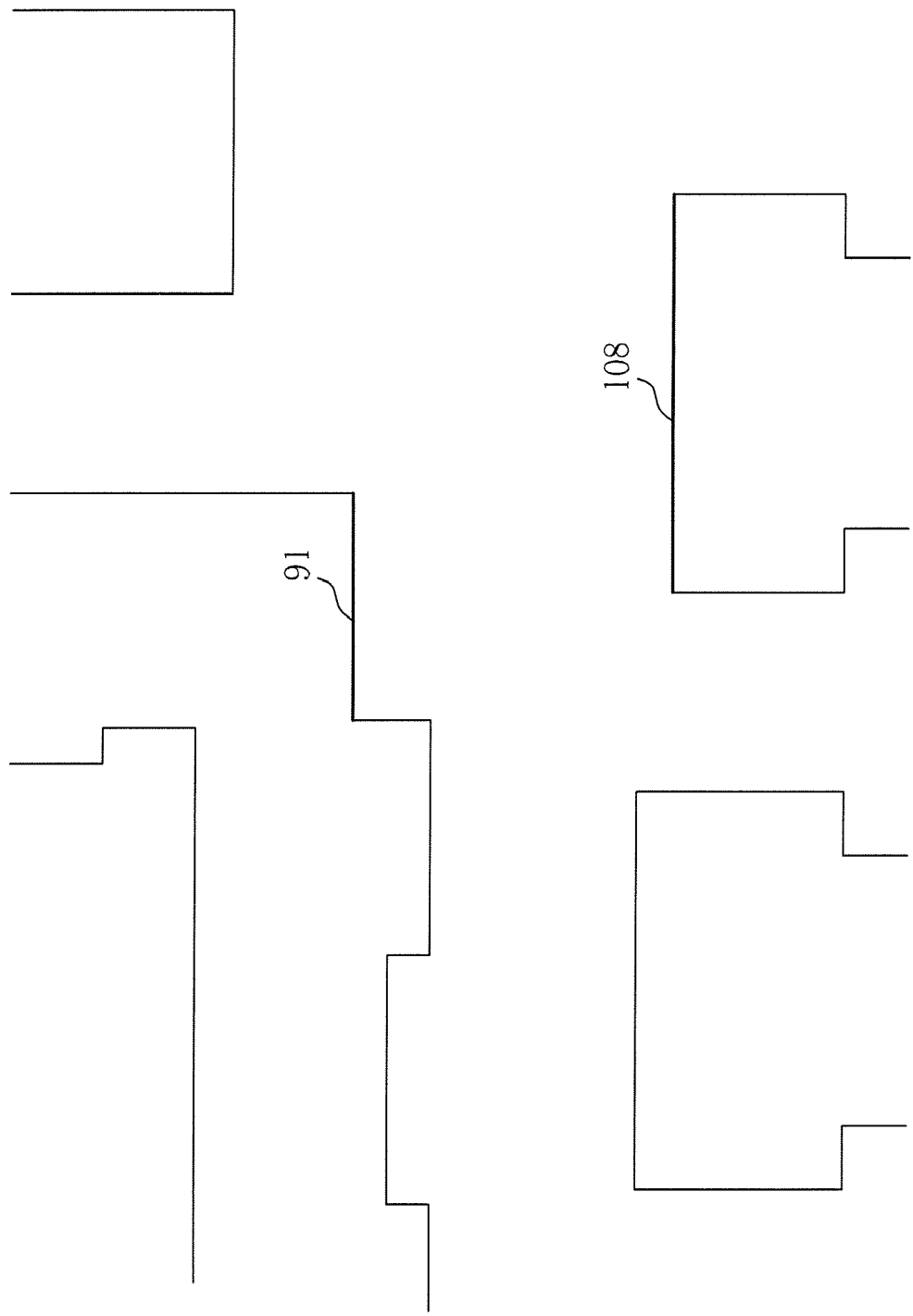

Please refer to FIG. 5 to FIG. 7, which are schematic diagrams illustrating an inward correction according to a preferred embodiment of the present invention. As shown in FIG. 5, following steps are carried out:

Step 1: inputting a mask pattern. The mask pattern includes at least a segment and has been corrected by at least an optical proximity correction. For highlighting the characteristic of the present invention and for clarity of illustration, FIG. 5 to FIG. 7 merely show a portion of segments 68, 69 of the mask pattern. In addition, the aforesaid optical proximity correction is a prevalent correction method used in the industries to correct widths, line ends, and corners of each segment in a mask pattern.

Step 2: inputting a process rule, such as a critical width and a critical space. The critical width and the critical space vary with different designed demands of the integrated circuits.

Step 3: selecting a target edge 70 for the first calculation. The target edge 70 includes an ahead checking point 72, a behind checking point 74, an ahead direction 76, and a behind direction 78. According to the orientation model of the present invention, the ahead direction 76 of the target edge 70 is parallel with the direction 2 of the coordinate axis (i.e. a=2) and the behind direction 78 of the target edge is parallel with the direction 2 of the coordinate axis (i.e. b=2); therefore, the target edge 70 belongs to the situation 12 (a=2, b=2) of the twenty-five situations as shown in FIG. 2.

Step 4: deciding that the target edge 70 needs an inward correction.

Step 5: providing a checking direction 80 from the ahead checking point 72 and providing checking directions 82, 84 from the behind checking point 74.

Step 6: identifying an interacting edge 86 for the first calculation along the checking directions 80, 82.

Step 7: performing a process rule check to provide a correcting value. For example, as the process rule is the aforesaid critical space, the correcting value is equal to or larger than a difference between the critical space and a distance 87 from the target edge 70 to the interacting edge 86.

Step 8: correcting the target edge 70. Namely, a first bias 88 is provided to the target edge 70. The correction takes the interacting edge 86 as a reference point to correct the target edge 70 in reverse to the interacting edge 86 as an edge 90. Therefore, a segment 92, which includes a corrected edge 91 from the first calculation, is obtained as shown in FIG. 6.

As shown in FIG. 6, following steps are carried out:

Step 9: selecting the interacting edge 86 as a target edge for the second calculation. The interacting edge 86 includes an ahead checking point 94, a behind checking point 96, an ahead direction 98, and a behind direction 100. According to the orientation model of the present invention, the ahead direction 94 of the interacting edge 86 is parallel to the direction 2 of the coordinate axis (i.e. a=2) and the behind direction 100 of the interacting edge 86 is parallel with the direction 6 of the coordinate axis (i.e. b=6); therefore, the interacting edge 86 belongs to the situation 15 (a=6, b=6) of the twenty-five situations as shown in FIG. 2.

Step 10: providing a checking direction 102 from the ahead checking point 94 and a checking direction 104 from the behind checking point 96.

Step 11: along the checking directions 102, 104, identifying the corrected edge 91. The corrected edge 91 is selected as the interacting edge for the second calculation.

Step 12: correcting the interacting edge 86. Namely, a second bias 106 is provided to the interacting edge 86. The correction takes the corrected target edge 91 as a reference point to correct the interacting edge 86 in reverse to the corrected target edge 91 as an edge 107.

Step 13: outputting a mask pattern, which is corrected by the first calculation and the second calculation, as shown in FIG. 7, including the corrected target edge 91 obtained from the first calculation, and the corrected interacting edge 108 obtained from the second calculation.

The aforesaid first bias 88 in step 8 is equal to the correcting value multiplying by a first percentage. And the second bias 106 in step 12 is equal to the correcting value multiplying by a second percentage. In addition, the sum of the first percentage and the second percentage is equal to one hundred percent. The value of the first percentage and the value of the second percentage vary with the conditions, such as the proportion of the length of the target edge to the length of the interacting edge, and the relative position of the target edge to the interacting edge, etc. According to the preferred embodiment of the present invention, the first percentage and the second percentage are both equal to fifty percent.

Figure 8:
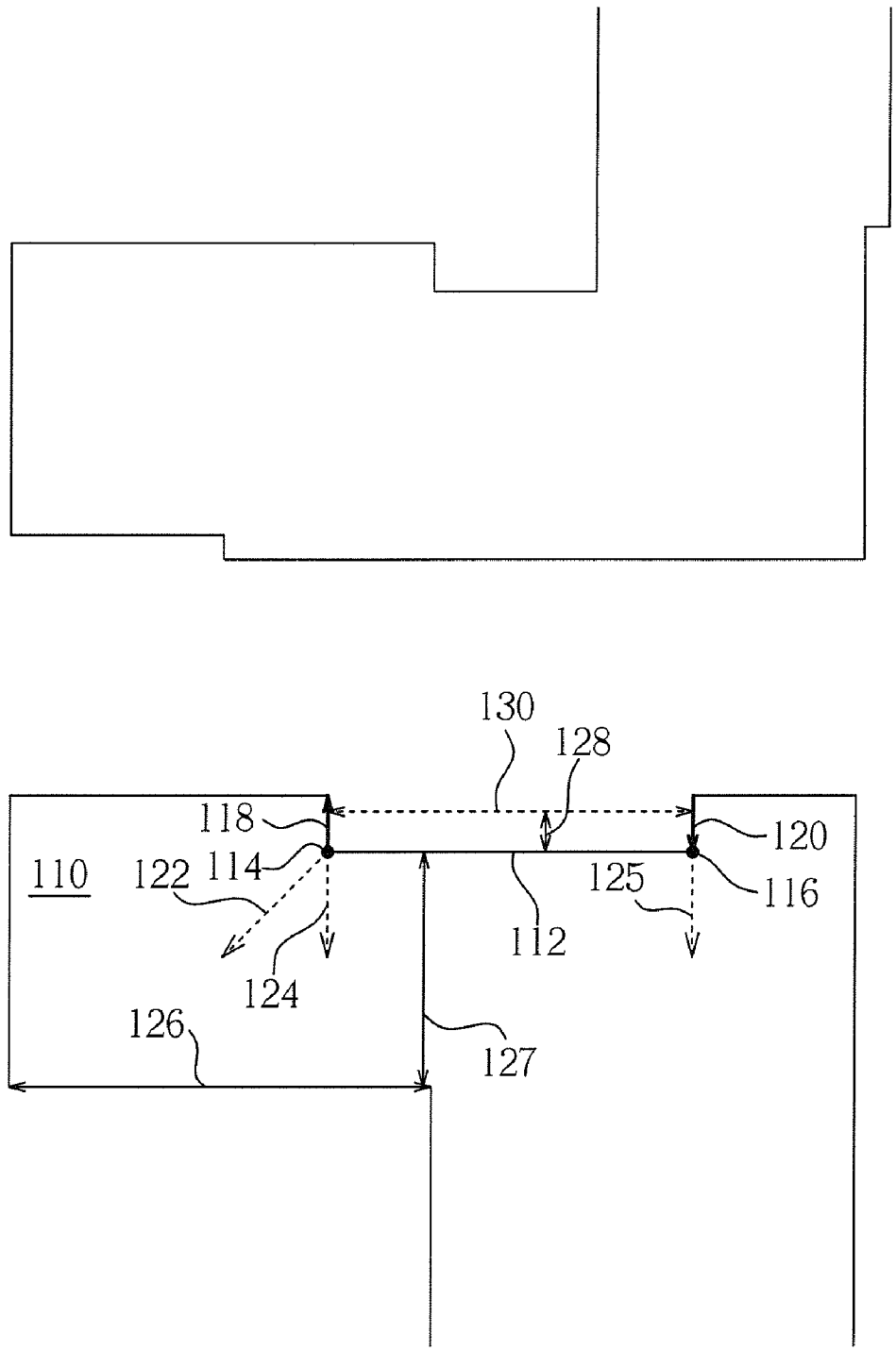
FIG. 8 to FIG. 10 are schematic diagrams, illustrating an outward correction according to another preferred embodiment of the present invention.
Figure 9:
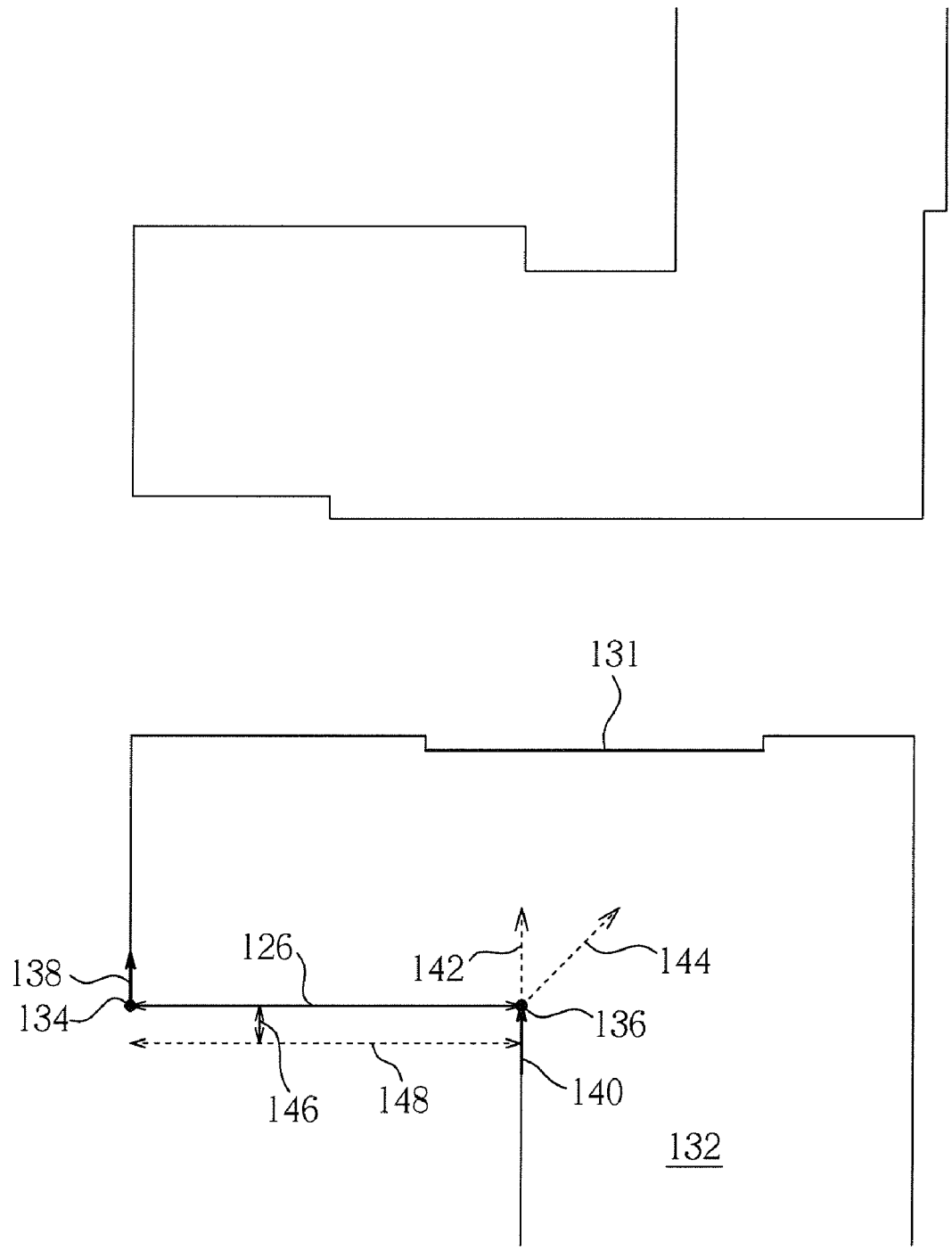
Figure 10:
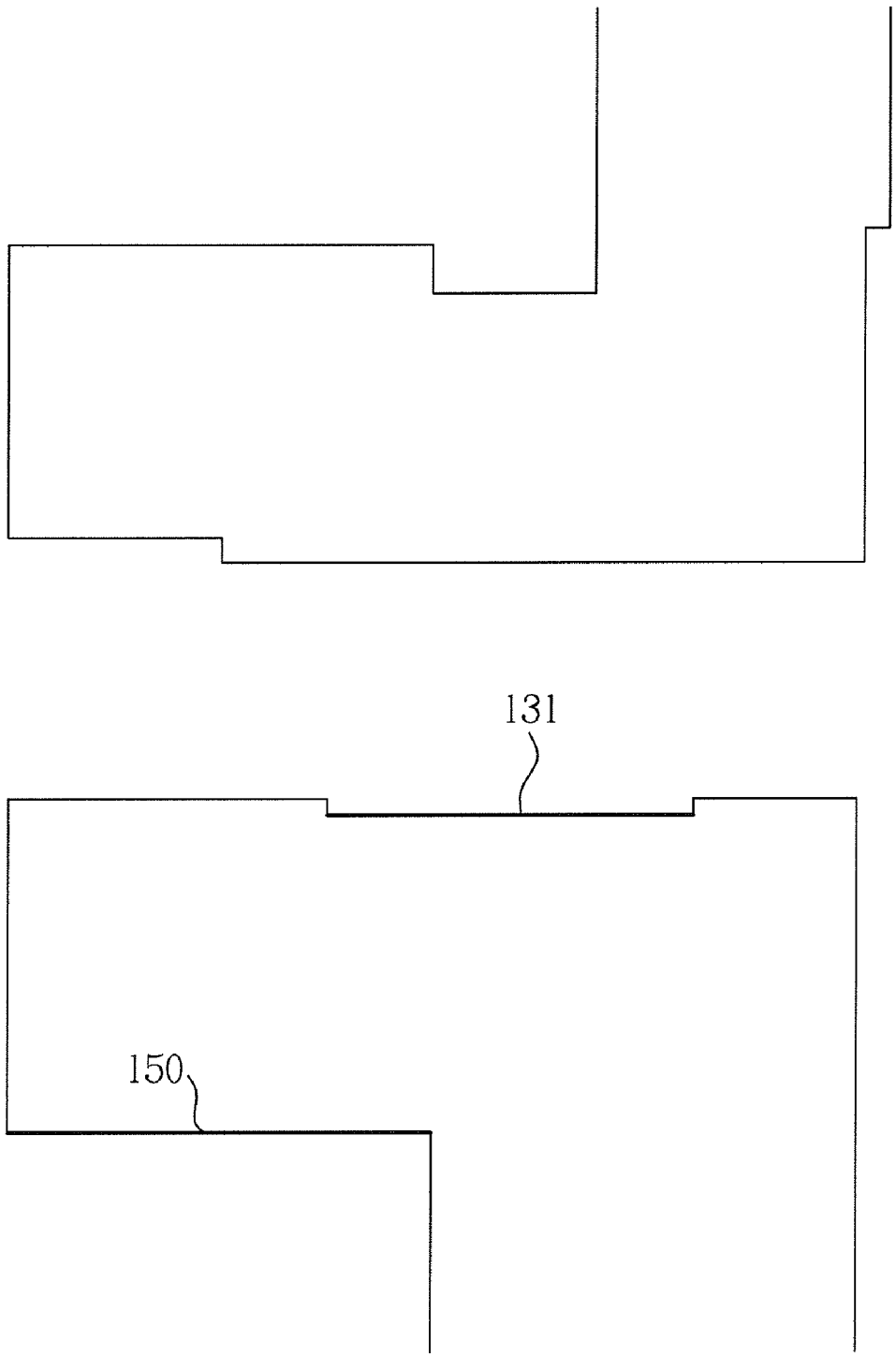

Please refer to FIG. 8 to FIG. 10, which are schematic diagrams illustrating an outward correction according to a preferred embodiment of the present invention. As shown in FIG. 8, following steps are carried out:

Step 1: inputting a mask pattern. The mask pattern includes at least a segment and has been corrected by at least an optical proximity correction. For highlighting the characteristic of the present invention and for clarity of illustration, FIG. 8 to FIG. 10 merely show a portion of segment 110 of the mask pattern. In addition, the optical proximity correction is a prevalent correction method used in the industries to correct widths, line ends, and corners of each segment in a mask pattern.

Step 2: inputting a process rule, such as a critical width and a critical space. The critical width and the critical space vary with different designed demands for the integrated circuits.

Step 3: selecting a target edge 112 for the first calculation. The target edge 112 includes an ahead checking point 114, a behind checking point 116, an ahead direction 118, and a behind direction 120. According to the orientation model of the present invention, the ahead direction 118 of the target edge 112 is parallel with the direction 6 of the coordinate axis (i.e. a=6) and the behind direction 120 of the target edge 112 is parallel with the direction 2 of the coordinate axis (i.e. b=2); therefore, the target edge 112 belongs to the situation 22 (a=6, b=2) of the twenty-five situations as shown in FIG. 2.

Step 4: deciding that the target edge 112 needs an outward correction.

Step 5: providing checking directions 122, 124 from the ahead checking point 114, and a checking direction 125 form the behind checking point 116.

Step 6: along the checking direction 122, 124, identifying an interacting edge 126 for the first calculation.

Step 7: performing a process rule check to provide a correcting value. For example, as the process rule is the aforesaid critical width, the correcting value is equal to or larger than a difference between the critical width and a distance 127 from the target edge 112 to the interacting edge 126.

Step 8: correcting the target edge 112. Namely, a first bias 128 is provided to the target edge 112. The correction takes the interacting edge 126 as a reference point to correct the target edge 112 in reverse to the interacting edge 126 as an edge 130. Therefore, a segment 132, which includes a corrected edge 131 from the first calculation, is obtained as shown in FIG. 9.

As shown in FIG. 9, following steps are carried out:

Step 9: selecting the interacting edge 126 as a target edge for the second calculation. The interacting edge 126 includes an ahead checking point 134, a behind checking point 136, an ahead direction 138, and a behind direction 140. According to the orientation model of the present invention, the ahead direction 138 of the interacting edge 126 is parallel to the direction 6 of the coordinate axis (i.e. a=6) and the behind direction 140 of the interacting edge 126 is parallel with the direction 6 of the coordinate axis (i.e. b=6); therefore, the interacting edge 126 belongs to the situation 25 (a=6, b=6) of the twenty-five situations as shown in FIG. 2.

Step 10: providing checking directions 142, 144 from the behind checking point 136.

Step 11: along the checking directions 142, 144, identifying the corrected edge 131. The corrected edge 131 is selected as the interacting edge for the second calculation.

Step 12: correcting the interacting edge 126. Namely, a second bias 146 is provided to the interacting edge 126. The correction takes the corrected target edge 131 as a reference point to correct the interacting edge 126 in reverse to the corrected target edge 131 as an edge 148.

Step 13: outputting a mask pattern, which is corrected by the first calculation and the second calculation, as shown in FIG. 10, including the corrected target edge 131 obtained from the first calculation, and the corrected interacting edge 150 obtained from the second calculation.

The aforesaid first bias 128 in step 8 is equal to the correcting value multiplying by a first percentage. And the second bias 146 in step 12 is equal to the correcting value multiplying by a second percentage. In addition, the sum of the first percentage and the second percentage is equal to one hundred percent. The value of the first percentage and the value of the second percentage vary with the conditions, such as the proportion of the length of the target edge to the length of the interacting edge, and the relative position of the target edge to the interacting edge, etc. According to the preferred embodiment of the present invention, the first percentage and the second percentage are both equal to fifty percent.

One characteristic of the present invention is to inspect a mask pattern, which has been corrected by at least an optical proximity correction. In addition, the present invention provides an orientation model to sort all edges of a mask pattern into different situations. And then all kinds of situations are checked and corrected one by one, so as to ensure the correctness of the mask pattern. Furthermore, the present invention provides two calculation programs to check and correct mask patterns. The two calculation programs can be written in any optical proximity correction program. Accordingly, the method of checking and correcting mask patterns of the present invention has the advantages of shortening the period of inspecting and correcting a mask pattern, reducing the loading of the computer resources and decreasing human resources for judging the correctness of mask patterns.

Those skilled in the art will readily observe that numerous modifications and alterations of the device and method may be made while retaining the teachings of the invention.

What is claimed is:

1. A method of checking and correcting a mask pattern, comprising:

inputting a mask pattern, wherein the mask pattern comprises at least a segment comprising a plurality edges;

inputting a process rule;

selecting a target edge from the plurality of edges in accordance with an angle-related orientation model for sorting the edges of the mask pattern into multiple different pattern situations, wherein two ends of the target edge are an ahead point and a behind point, an ahead direction extending along a periphery of the target edge from the ahead point, a behind direction linking to the behind point along the periphery of the target edge, and the ahead point and the behind point each further comprise at least a checking direction;

wherein the ahead direction is parallel to one of the directions in the orientation model and the behind direction is parallel to one of the directions in the orientation model;

identifying an interacting edge in proximity to the target edge from the mask pattern along the checking directions;

performing, by using a computer, a process rule check in accordance to the process rule to provide a correcting value in order to adjusting the relative position of the target edge and the interacting edge;

performing a first correction to provide a first bias to the target edge; and performing a second correction to provide a second bias to the interacting edge, wherein a sum of the first bias and the second bias equals the correcting value to output a corrected mask pattern.

2. The method of claim 1, wherein the mask pattern is corrected by at least an optical proximity correction to correct widths, line ends and corners of the segment.

3. The method of claim 1, wherein the process rule comprises a critical width and a critical space.

4. The method of claim 3, wherein the correcting value is equal to or larger than a difference between the critical width and a length extending from the target edge to the interacting edge.

5. The method of claim 3, wherein the correcting value is equal to or larger than a difference between the critical space and a length extending from the target edge to the interacting edge.

6. The method of claim 1, wherein the first correction employs the interacting edge as a reference point to correct the target edge in reverse to the interacting edge.

7. The method of claim 1, wherein the second correction employs the target edge as a reference point to correct the interacting edge in reverse to the target edge.

8. The method of claim 1, wherein the first bias is equal to the correcting value multiplying by a first percentage.

9. The method of claim 8, wherein the second bias is equal to the correcting value multiplying by a second percentage.

10. The method of claim 1, wherein sum of the first percentage and the second percentage is equal to 100 percent.

11. The method of claim 10, wherein the first percentage is 50 percent and the second percentage is 50 percent.

12. The method of claim 1, wherein the orientation model equally divides a plan into a quantity of directions, wherein the quantity is equal to 360° dividing by an angle.

13. The method of claim 12, wherein the angle is of 45° and the plane is divided into eight directions.

14. The method of claim 13, wherein the orientation model comprises twenty-five situations.

* * * * *